United States Patent
Zhao et al.

(10) Patent No.: US 11,196,012 B2
(45) Date of Patent: Dec. 7, 2021

(54) FLEXIBLE ORGANIC LIGHT-EMITTING PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Jiaxiang Zhao, Wuhan (CN); Wenjin Cheng, Wuhan (CN)

( * ) Notice: Subject to any disclaimer, the term of this patent is extended or adjusted under 35 U.S.C. 154(b) by 349 days.

(21) Appl. No.: 16/331,146

(22) PCT Filed: Dec. 13, 2018

(86) PCT No.: PCT/CN2018/120980
§ 371 (c)(1),
(2) Date: Mar. 7, 2019

(87) PCT Pub. No.: WO2020/082540
PCT Pub. Date: Apr. 30, 2020

(65) Prior Publication Data
US 2021/0184140 A1    Jun. 17, 2021

(30) Foreign Application Priority Data

Oct. 26, 2018    (CN) .......................... 201811259376.9

(51) Int. Cl.
*H01L 51/00* (2006.01)
*H01L 51/56* (2006.01)
*H01L 27/32* (2006.01)

(52) U.S. Cl.
CPC ...... *H01L 51/0097* (2013.01); *H01L 27/3258* (2013.01); *H01L 51/56* (2013.01); *H01L 2251/5338* (2013.01)

(58) Field of Classification Search
None
See application file for complete search history.

(56) References Cited

U.S. PATENT DOCUMENTS

2015/0188092 A1*    7/2015  Park ................... H01L 51/5271
                                                          257/40
2017/0154935 A1     6/2017  Cai
                      (Continued)

FOREIGN PATENT DOCUMENTS

CN    105845701 A    8/2016
CN    106449702 A    2/2017
                (Continued)

OTHER PUBLICATIONS

Definition of 'on' downloaded from URL<https://www.merriam-webster.com/dictionary/on> downloaded on Jul. 16, 2021 (Year: 2021).*

*Primary Examiner* — J. E. Schoenholtz (57) ABSTRACT

The present invention provides a flexible OLED panel including a display area for configuring a pixel structure, the display area including a plurality of first bendable structures extending along a first direction, a plurality of second bendable structures extending along a second direction and a display unit. The second bendable structure intersects the first bendable structure to form a plurality of sub-display areas. The display unit is disposed in the sub-display area, and the display unit includes at least one sub-pixel.

19 Claims, 7 Drawing Sheets

(56) References Cited

U.S. PATENT DOCUMENTS

| | | | |
|---|---|---|---|
| 2017/0263888 A1* | 9/2017 | Choi | G02F 1/133305 |
| 2019/0096975 A1* | 3/2019 | Park | H01L 51/5253 |
| 2020/0243778 A1* | 7/2020 | Li | H01L 27/3258 |

FOREIGN PATENT DOCUMENTS

| | | |
|---|---|---|
| CN | 107833906 A | 3/2018 |
| CN | 107968152 A | 4/2018 |
| CN | 108288637 A | 7/2018 |
| CN | 108448009 A | 8/2018 |
| CN | 108461393 A | 8/2018 |
| KR | 20150112715 A | 10/2015 |

* cited by examiner

FLEXIBLE ORGANIC LIGHT-EMITTING PANEL AND MANUFACTURING METHOD THEREOF

BACKGROUND OF INVENTION

Field of Invention

The present invention relates to a display technology, and in particular to a flexible organic light-emitting diode (OLED) panel and a manufacturing method thereof.

Description of Prior Art

Flexible organic light-emitting diode (OLED) panels have advantages such as wide color gamut, high contrast ratio, large viewing angle, fast response rate, and light weight. In fields of mobile phones, watches, pads and other applications, with the consumer's love for the big screen, the screen ratio is getting higher and higher.

At present, flexible bending OLED panels are mainly divided into static bending and dynamic bending. The bending of the panel can only be bent in the vertical direction or the horizontal direction. The bending direction is limited, and the bending radius is large.

Therefore, it is necessary to provide a flexible OLED panel and a manufacturing method thereof to solve the above technical problems.

SUMMARY OF INVENTION

An embodiment of the present invention provides a flexible OLED panel and a manufacturing method thereof to solve the technical problem that the bending direction of the existing flexible OLED panel is relatively limited and the bending radius is large.

An embodiment of the present invention provides a flexible OLED panel, including a display area for configuring a pixel structure, wherein the display area includes: a plurality of first bendable structures extending along a first direction for reducing bending stress in the display area perpendicular to the first direction; a plurality of second bendable structures extending along a second direction for reducing bending stress in the display area perpendicular to the second direction, wherein the second bendable structure intersects the first bendable structure to form a plurality of sub-display areas; and a display unit disposed in the sub-display areas, the display unit including at least one sub-pixel;

The display area including: a flexible substrate; a buffer layer disposed on the flexible substrate; an active layer disposed on the buffer layer; a first insulating layer disposed on the active layer; a first gate metal layer disposed on the first insulating layer; a second insulating layer disposed on the first gate metal layer; a second gate metal layer disposed on the second insulating layer; and a first interlayer dielectric layer disposed on the second gate metal layer; a recess disposed at the display area corresponding to the first bendable structure and the second bendable structure, and penetrating through the buffer layer, the first insulating layer, the second insulating layer and the first interlayer dielectric layer; a second interlayer dielectric layer disposed on the first interlayer dielectric layer and filling the recess, the second interlayer dielectric layer being made of an organic material; wherein each of the first bendable structure and the second bendable structure includes the recess and a portion of the second interlayer dielectric layer corresponding to the recess; the display area including a center region located at a center position of the display area and a border region around the center region; and a density of the sub-display areas in the center region is greater than a density of the sub-display areas in the border region.

In the flexible OLED panel of the present invention, the recess of the first bendable structure extends along the extending direction of the first bendable structure, and the recess of the second bendable structure extends along the extending direction of the second bendable structure.

In the flexible OLED panel of the present invention, the display area further includes a source/drain metal layer disposed on the second interlayer dielectric layer, wherein connection traces of the source/drain metal layers at regions corresponding to the first bendable structure and the second bendable structure are in an undulating shape.

In the flexible OLED panel of the present invention, the flexible OLED panel includes a first metal line passing through the first bendable structure and disposed in a same level as the source/drain metal layer and a second metal line passing through the second bendable structure and disposed in a different level from the source/drain metal layer, wherein the first metal trace includes the connection traces at the region corresponding to the first bendable structure, while the second metal trace includes the connection traces at the region corresponding to the second bendable structure.

In the flexible OLED panel of the present invention,

In the flexible OLED panel of the present invention, the source/drain metal layer includes a titanium sublayer, an aluminum sublayer, and a titanium sublayer disposed sequentially.

The present invention also provides a flexible OLED panel, including a display area for configuring a pixel structure, wherein the display area includes: a plurality of first bendable structures extending along a first direction, the first bendable structures for reducing bending stress in the display area perpendicular to the first direction; a plurality of second bendable structures extending along a second direction the second bendable structures for reducing bending stress in the display area perpendicular to the second direction, wherein the second bendable structure intersects the first bendable structure to form a plurality of sub-display areas; and a display unit disposed in the sub-display areas, the display unit including at least one sub-pixel.

In the flexible OLED panel of the present invention, the display area includes: a flexible substrate; a buffer layer disposed on the flexible substrate; an active layer disposed on the buffer layer; a first insulating layer disposed on the active layer; a first gate metal layer disposed on the first insulating layer; a second insulating layer disposed on the first gate metal layer; a second gate metal layer disposed on the second insulating layer; and a first interlayer dielectric layer disposed on the second gate metal layer; a recess disposed at the display area corresponding to the first bendable structure and the second bendable structure, and penetrating through the buffer layer, the first insulating layer, the second insulating layer and the first interlayer dielectric layer; a second interlayer dielectric layer disposed on the first interlayer dielectric layer and filling the recess, the second interlayer dielectric layer being made of an organic material; wherein each of the first bendable structure and the second bendable structure includes the recess and a portion of the second interlayer dielectric layer corresponding to the recess.

In the flexible OLED panel of the present invention, the recess of the first bendable structure extends along the extending direction of the first bendable structure, and the recess of the second bendable structure extends along the extending direction of the second bendable structure.

In the flexible OLED panel of the present invention, the display area further includes a source/drain metal layer disposed on the second interlayer dielectric layer, wherein connection traces of the source/drain metal layers at regions corresponding to the first bendable structure and the second bendable structure having an undulating shape.

Optionally, the shape of the connecting trace may be one of a zigzag shape, a wave shape, a pulse shape, and a concave-convex line shape.

In the flexible OLED panel of the present invention, the flexible OLED panel includes a first metal line passing through the first bendable structure and disposed in a same level as the source/drain metal layer and a second metal line passing through the second bendable structure and disposed in a different level from the source/drain metal layer, wherein the first metal trace includes the connection traces at the region corresponding to the first bendable structure, while the second metal trace includes the connection traces at the region corresponding to the second bendable structure.

The first metal is in parallel with the extending direction of the second bendable structure, while the second metal wire is in parallel with the extending direction of the first bendable structure, and the first metal wire includes an EVDD line (that is an electrode at a side where a capacitor and a Vdd is connected) and a Vdata line, and the second metal line includes a scan line, an xScan line, and an EM line.

In the flexible OLED panel of the present invention, the source/drain metal layer includes a titanium sublayer, an aluminum sublayer, and a titanium sublayer disposed sequentially.

In the flexible OLED panel of the present invention, the display area includes a center region located at a center position of the display area and a border region around the center region, and a density of the sub-display areas in the center region is greater than a density of the sub-display areas in the border region.

In the flexible OLED panel of the present invention, a number of the sub-pixels of each display unit at the center region is less than a number of the sub-pixels of each display unit at the border region.

In the flexible OLED panel of the present invention, the width of the first bendable structure and the second bendable structure are both greater than 5 micrometers, such as 6 micrometers, 7 micrometers, 8 micrometers, 9 micrometers, and 10 micrometers, etc.

The present invention further relates to a method of fabricating a flexible OLED panel, wherein the OLED panel includes a display area for configuring a pixel structure, the display area including a first bendable structure for bending, a second bendable structure for bending, and a display unit disposed in sub-display areas defined by intersecting the first bendable structure and the second bendable; the method including:

S101: providing a glass substrate;

S102: sequentially forming a flexible substrate, a buffer layer, an active layer, a first insulating layer, a first gate metal layer, a second insulating layer, a second gate metal layer, and a first interlayer dielectric on the glass substrate;

S103: forming recesses at regions respectively corresponding to the first bendable structure and the second bendable structure;

S104: forming a second interlayer dielectric layer on the first interlayer dielectric layer and filling the recess, the second interlayer dielectric layer being made of an organic material;

S105: patterning the second interlayer dielectric layer on the first bendable structure and the second bendable structure, so that a surface of the second interlayer dielectric layer is formed into an undulating shape;

S106: forming a source/drain metal layer on the second interlayer dielectric layer, so that connection traces of the source/drain metal layers at regions corresponding to the first bendable structure and the second bendable structure are in an undulating shape;

S107: forming a planarization layer on the source/drain metal layer;

S108: forming an anode at a region corresponding to the display unit on the planarization layer; and S109: forming a pixel definition layer on the anode.

In the method of fabricating a flexible OLED panel of the present invention, in the step S105, the second interlayer dielectric layer corresponding to the recess region is subjected to a photolithography process using a halftone mask.

In the method of fabricating a flexible OLED panel of the present invention, in the step S103, the recess is formed by one or two photolithography processes.

In the method of fabricating a flexible OLED panel of the present invention, the recess of the first bendable structure extends along the extending direction of the first bendable structure, and the recess of the second bendable structure extends along the extending direction of the second bendable structure.

In the method of fabricating a flexible OLED panel of the present invention, the flexible OLED panel includes a first metal line passing through the first bendable structure and disposed in a same level as the source/drain metal layer and a second metal line passing through the second bendable structure and disposed in a different level from the source/drain metal layer, wherein the first metal trace includes the connection traces at the region corresponding to the first bendable structure, while the second metal trace includes the connection traces at the region corresponding to the second bendable structure.

In the method of fabricating a flexible OLED panel of the present invention, the source/drain metal layer includes a titanium sublayer, an aluminum sublayer, and a titanium sublayer disposed sequentially.

In the method of fabricating a flexible OLED panel of the present invention, the display area includes a center region located at a center position of the display area and a border region around the center region, and a density of the sub-display areas in the center region is greater than the density of the sub-display areas located in the border region.

In the method of fabricating a flexible OLED panel of the present invention, a number of the sub-pixels of each display unit at the center region is less than a number of the sub-pixels of each display unit at the border region.

In the method of fabricating a flexible OLED panel of the present invention, the widths of the first bendable structure and the second bendable structure are both greater than 5 micrometers, such as 6 micrometers, 7 micrometers, 8 micrometers, 9 micrometers, and 10 micrometers.

Compared with the existing flexible OLED panel and the manufacturing method, the flexible OLED panel and the manufacturing method of the present invention provide a first bendable structure extending in a first direction and a second bending extending in a second direction in the display area. When the flexible OLED panel is bent, the first bendable structure and the second bendable structure reduce the bending stress, thereby realizing bending of the entire panel. The bending effect includes bending and twisting along vertical horizontal directions. The technical problem that the bending direction of the existing flexible OLED panel is relatively limited and the bending radius is large is solved.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Please refer to the figures in the drawings, in which, like numbers refer to like elements throughout the description of the figures. Hereinafter, the present invention will be described in further detail with reference to examples. It is to be understood, however, that these examples are for illustrative purposes only and are not intended to limit the scope of the present invention.

Figure 1:
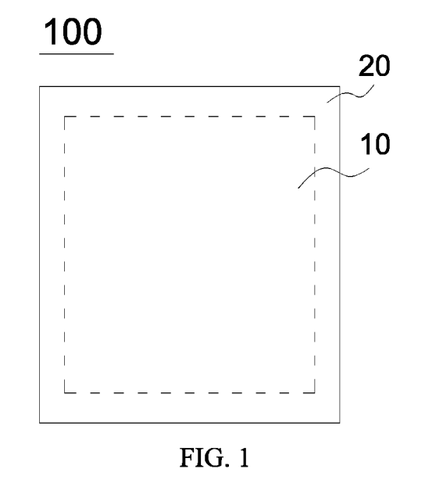
FIG. 1 is a schematic diagram of a structure of a flexible OLED panel according to a first embodiment of the present invention.
Figure 2:
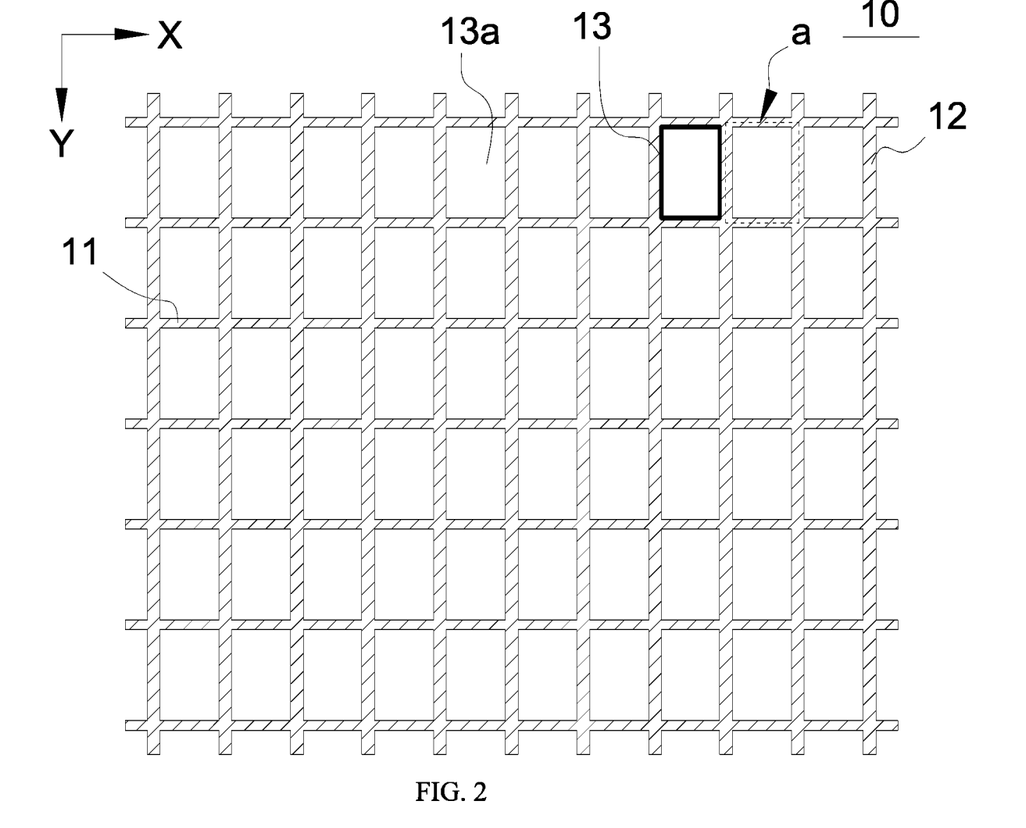
FIG. 2 is a schematic diagram of a first structure of a display area of a flexible OLED panel according to a first embodiment of the present invention.

Referring to FIG. 1 and FIG. 2, FIG. 1 is a schematic diagram of a structure of a flexible OLED panel according to a first embodiment of the present invention, and FIG. 2 is a schematic diagram of a first structure of a display area of a flexible OLED panel according to a first embodiment of the present invention.

A flexible OLED panel 100 according to a first embodiment of the present invention includes a display area 10 for configuring a pixel structure and a non-display area 20 located around the display area 10. The display area 10 includes a plurality of first bendable structures 11, a plurality of second bendable structures 12 and a display unit 13. It should be noted that the display unit 13 includes a pixel self-luminescent structure and a pixel driving circuit structure that drives the pixel self-luminescent structure.

The first bendable structure 11 extends along the first direction X. The first bendable structure 11 is for reducing the bending stress in the display area 13 perpendicular to the first direction X. The second bendable structure 12 extends along the second direction Y. The second bendable structure 12 is for reducing the bending stress in the display area 13 perpendicular to the second direction Y. The second bendable structure 12 intersects the first bendable structure 11 to form a plurality of sub-display areas a. The display unit 13 is disposed in the sub-display area a, and the display unit 13 includes at least one sub-pixel 13a.

In the first embodiment, the first direction X and the second direction Y are orthogonally arranged to each other. Of course, the first direction X and the second direction Y may also be other ways of intersecting, such as the first direction and the second direction are arranged at an angle of 45°, and so on. Therefore, the present invention is not particularly limited.

In addition, in the first embodiment, it should be noted that the bending stress generated on the flexible OLED panel 100 can be decomposed into bending stresses in the first direction X and the second direction Y. In the first embodiment, the display unit 13 includes only one sub-pixel 13a as an example, but is not limited thereto. For example, the display unit may also be a pixel formed by three sub-pixels, or a pixel repeating combination composed of at least two pixels, and the like.

In the first embodiment, one sub-pixel 13a is used as the display unit 13, such that a density of the first bendable structure 11 and the second bendable structure 12 (the number of the first bendable structure and the second bendable structure per unit area) reach the maximum, and thus the bending radius of the OLED panel is maximized. That is, the more the sub-pixels 13a included in the display unit 13, the smaller the density of the first bendable structure 11 and the second bendable structure 12. In this embodiment, the sub-pixel 13a includes a driving circuit structure of a sub-pixel, and the driving circuit structure includes a thin film transistor.

In the first embodiment, the first bendable structure 11 and the second bendable structure 12 are provided in the display area 10 of the flexible OLED panel 100, to reduce the bending stress generated when the OLED panel 100 is bent, thereby realize bending effects of the entire panel 100 in the vertical direction, the horizontal direction, and the twisting.

Figure 3:
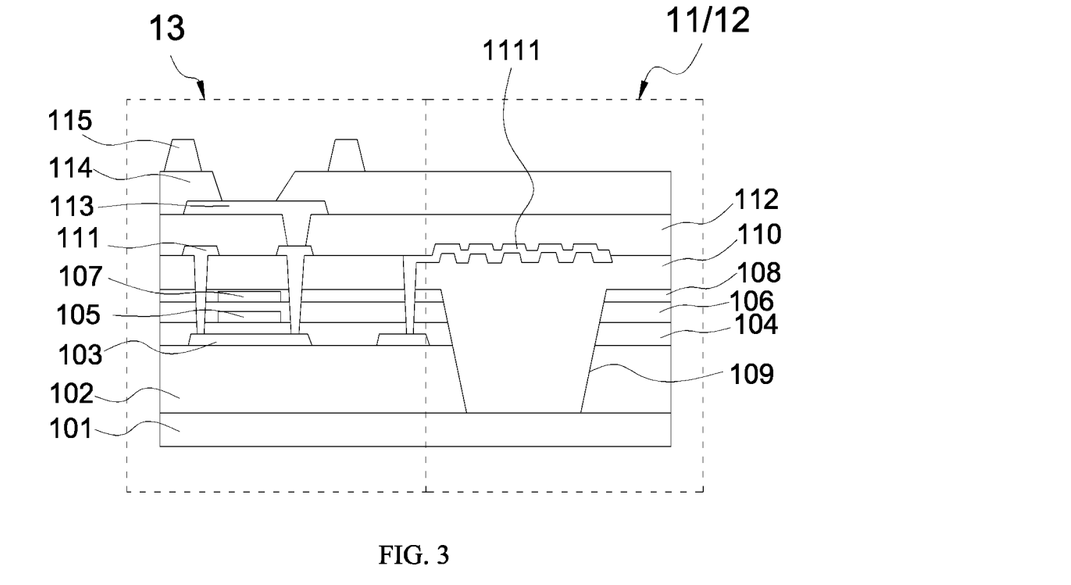
FIG. 3 is a schematic diagram of a second structure of a display area of a flexible OLED panel according to a first embodiment of the present invention.

Please refer to FIG. 3. FIG. 3 is a schematic diagram of a second structure of a display area of a flexible OLED panel according to a first embodiment of the present invention. The display area 10 includes a flexible substrate 101; a buffer layer 102 disposed on the flexible substrate 101; an active layer 103 disposed on the buffer layer 102; a first insulating layer 104 disposed on the active layer 103; a first gate metal layer 105 disposed on the first insulating layer 104; a second insulating layer 106 disposed on the first gate metal layer 105; a second gate metal layer 107 disposed on the second insulating layer 106; and a first interlayer dielectric layer 108 disposed on the second gate metal layer 107; a recess 109 disposed at the display area 10 corresponding to the first bendable structure 11 and the second bendable structure 12, and penetrating through the buffer layer 102, the first insulating layer 104, the second insulating layer 106 and the first interlayer dielectric layer 108; a second interlayer dielectric layer 110 disposed on the first interlayer dielectric layer 108 and filling the recess 109; a source/drain metal layer 111 disposed on the second interlayer dielectric layer 110; a planarization layer 112 disposed on the source/drain metal layer 111; an anode 113 disposed at a region corresponding to the display unit 13 on the planarization layer 112; a pixel definition layer 114 disposed on the anode 113; and a spacer 116 disposed on the pixel definition layer 114.

The first bendable structure 11 and the second bendable structure 12 are identical in structure, that is, each of the first bendable structure 11 and the second bendable structure 12 includes a flexible substrate 101, a recess 109, and a second interlayer dielectric layer 110 covering and filling the recess 109. Of course, in the present invention, the structures of the first bendable structure 11 and the second bendable structure 12 may be different as long as bending can be achieved.

The display unit 13 includes a flexible substrate 101, an active layer 103, a first insulating layer 104, a first gate metal layer 105, a second insulating layer 106, a second gate metal layer 107, a first interlayer dielectric layer 108, a second interlayer dielectric layer 110, a source/drain metal layer 111, a planarization layer 112, a anode 113, a pixel defining layer 114, a spacer 115, and an organic light emitting layer (not shown).

In the first embodiment, the second interlayer dielectric layer 110 is made of an organic material. The second interlayer dielectric layer 110 made of an organic material fills the recess 109 to improve the bending resistance of the first bendable structure 11 and the second bendable structure 12.

In the first embodiment, the recess 109 of the first bendable structure 11 extends along an extending direction of the first bendable structure 11, and the recess 109 of the second bendable structure 12 extends along an extending direction of the second bendable structure 12. Such an arrangement results in a grid-like recess formed by the first bendable structure 11 and the second bendable structure 12 in the display area 10, and the second interlayer dielectric layer 110 fills the recess 109 to form a bending structure network covering the entire display area 10, and thus, the bending performance of the flexible OLED panel 100 is improved.

In addition, the widths of the first bendable structure 11 and the second bendable structure 12 may each be set to be greater than 5 micrometers, such as 6 micrometers, 7 micrometers, 8 micrometers, 9 micrometers, and 10 micrometers. Of course, as the technique is improved, the widths of the first bendable structure 11 and the second bendable structure 12 can be further reduced.

In the first embodiment, the connection traces 1111 of the source/drain metal layers 111 corresponding to the first bendable structure 11 and the second bendable structure 12 are all undulating. Such an arrangement improves the bending performance of the connection trace 1111 and reduces the stress damage of the connection trace 1111. Optionally, the shape of the connection trace 1111 may be one of a zigzag shape, a wave shape, a pulse shape, and a concave-convex line shape.

In addition, the source/drain metal layer 111 includes a titanium metal sublayer, an aluminum metal sublayer, and a titanium metal sublayer which are sequentially disposed. The source/drain metal layer 111 has a structure of Ti/Al/Ti, which further improves the bending performance of the connection trace 1111.

In the first embodiment, the flexible OLED panel 100 includes a first metal line passing through the first bendable structure 11 and disposed in the same level as the source/drain metal layer 111 and a source and drain through the second bendable structure 12. The second metal line of the metal layer 111 is disposed in a different level. The first metal trace includes a connection trace 1111 at the region corresponding to the first bendable structure 11. The second metal trace includes a connection trace 1111 at the region corresponding to the first bendable structure 12.

The first metal is parallel to the extending direction of the second bendable structure 12. The second metal wire is parallel to the extending direction of the first bendable structure 11. The first metal line includes an EVDD line (that is an electrode at a side where a capacitor and a Vdd is connected) and a Vdata line, and the second metal line includes a scan line, an xScan line, and an EM line.

Figure 4:
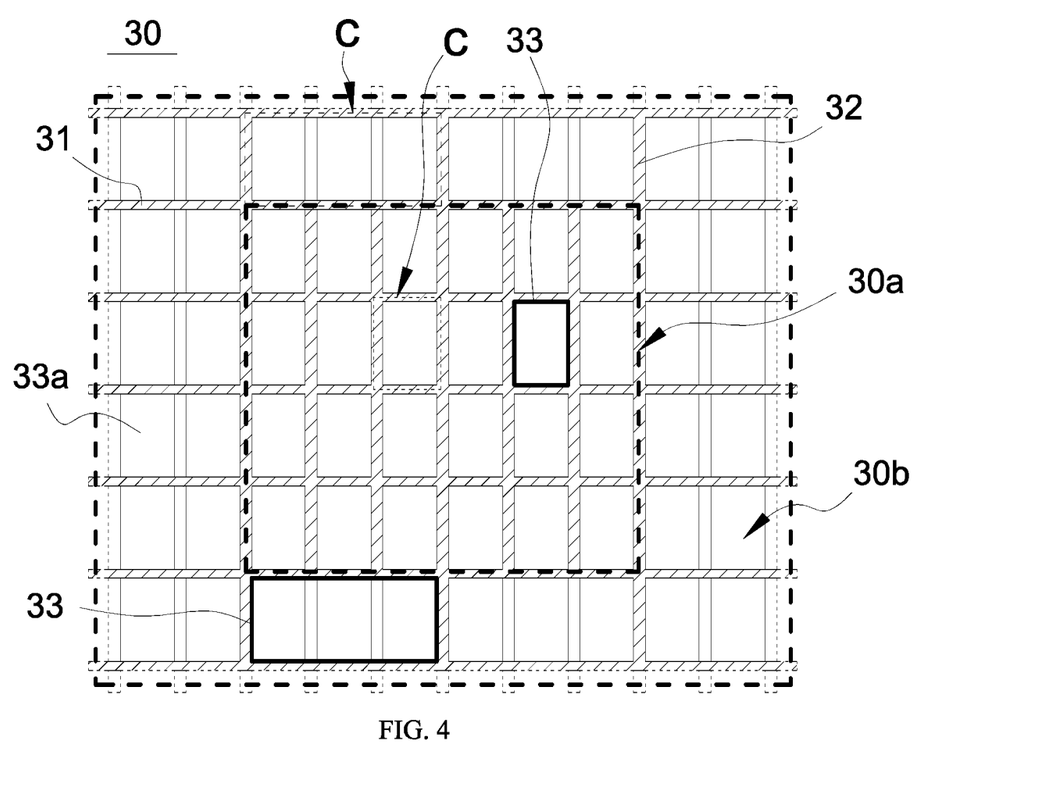
FIG. 4 is a schematic diagram of a structure of a flexible OLED panel according to a second embodiment of the present invention.

Please refer to FIG. 4. FIG. 4 is a schematic diagram of a structure of a flexible OLED panel according to a second embodiment of the present invention. In the second embodiment, the difference from the first embodiment is that the display area 30 includes a center region 30a located at a center position of the display area 230 and a border region 30b around the center region 30a, and the density of the sub-display area c located in the center region 30a is greater than the density of the sub-display area c located in the border region 30b.

When the flexible OLED panel is bent over the entire surface, the center region 30a of the display area 30 is subjected to a bending stress greater than the bending stress of the border region 30b of the display area 30. Therefore, in the second embodiment, the arrangement is adjusted based on the above concern. Such an arrangement effectively reduces the density of the first bendable structure 31 and the second bendable structure 32, thereby reducing the cost under the premise of ensuring realization of full bending of the panel.

In the present second embodiment, specifically, a number of sub-pixels 33a of each display unit 33 at the center portion 30a is smaller than a number of sub-pixels 33a of each display unit 33 at the border region 30b.

Figure 5:
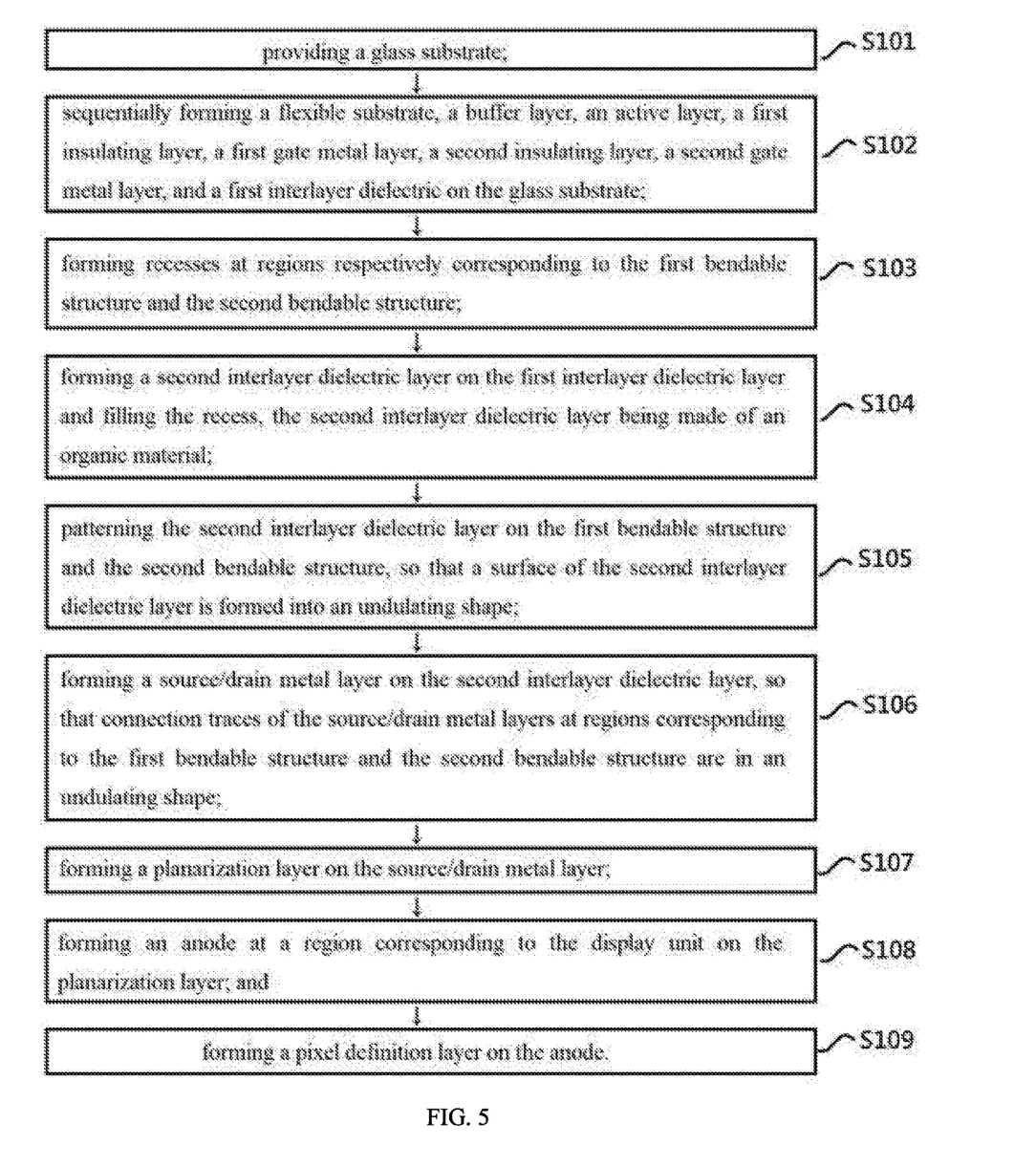
FIG. 5 is a flow chart of a method of fabricating a flexible OLED panel according to an embodiment of the present invention.
Figure 6:
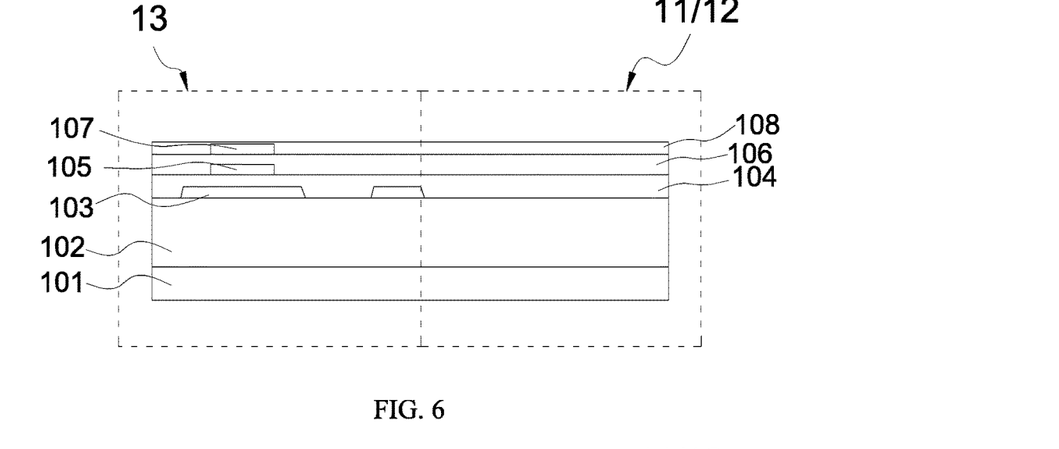
FIG. 6 is a schematic diagram of a structure obtained after completing the step 102 according to an embodiment of a method of fabricating a flexible OLED panel of the present invention.
Figure 7:
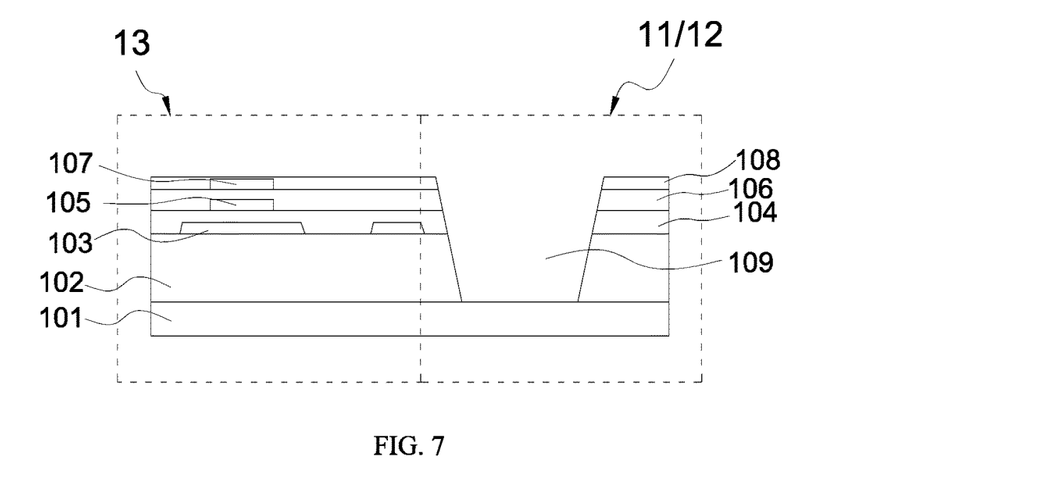
FIG. 7 is a schematic diagram of a structure obtained after completing the step 103 according to an embodiment of a method of fabricating a flexible OLED panel of the present invention.
Figure 8:
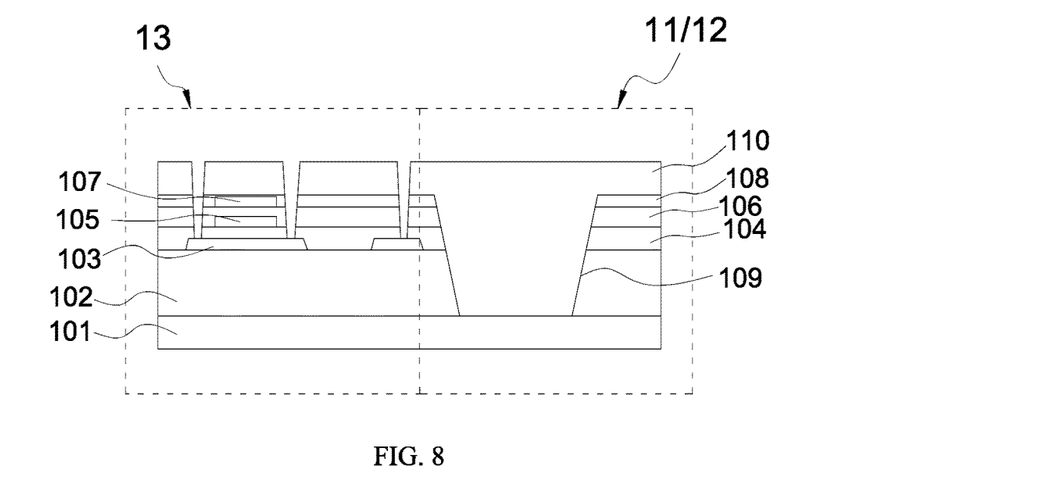
FIG. 8 is a schematic diagram of a structure obtained after completing the step 104 according to an embodiment of a method of fabricating a flexible OLED panel of the present invention.
Figure 9:
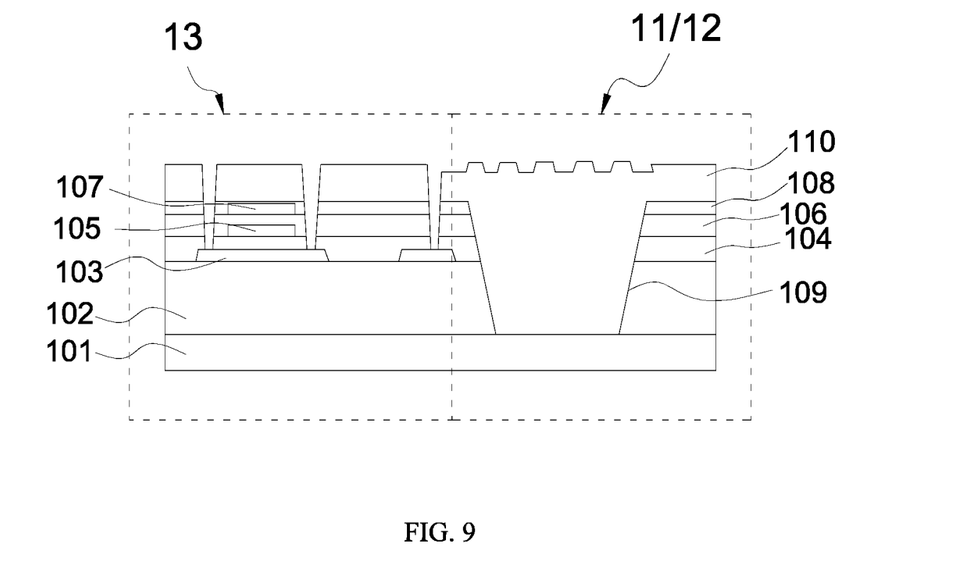
FIG. 9 is a schematic diagram of a structure obtained after completing the step 105 according to an embodiment of a method of fabricating a flexible OLED panel of the present invention.
Figure 10:
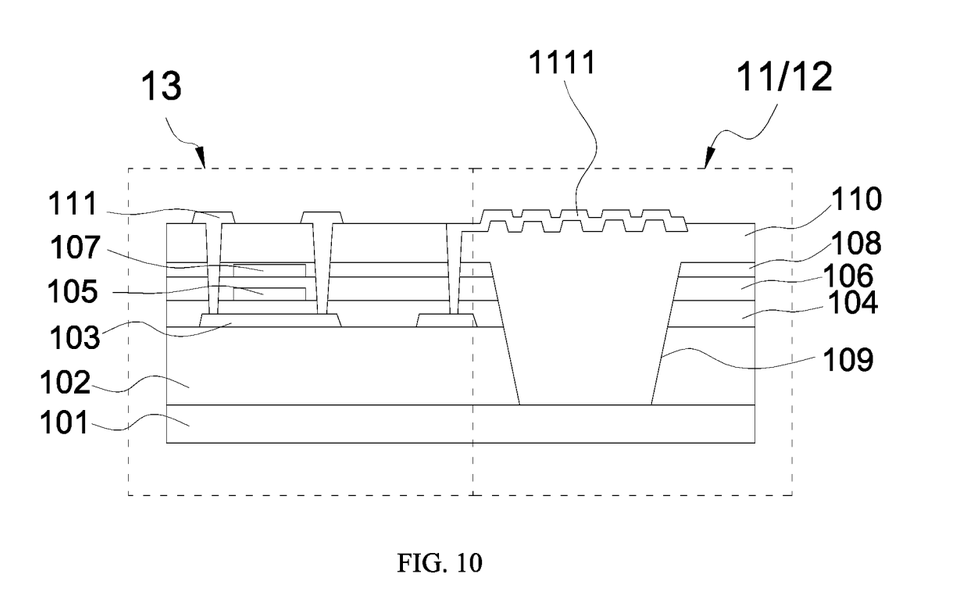
FIG. 10 is a schematic diagram of a structure obtained after completing the step 106 according to an embodiment of a method of fabricating a flexible OLED panel of the present invention.
Figure 11:
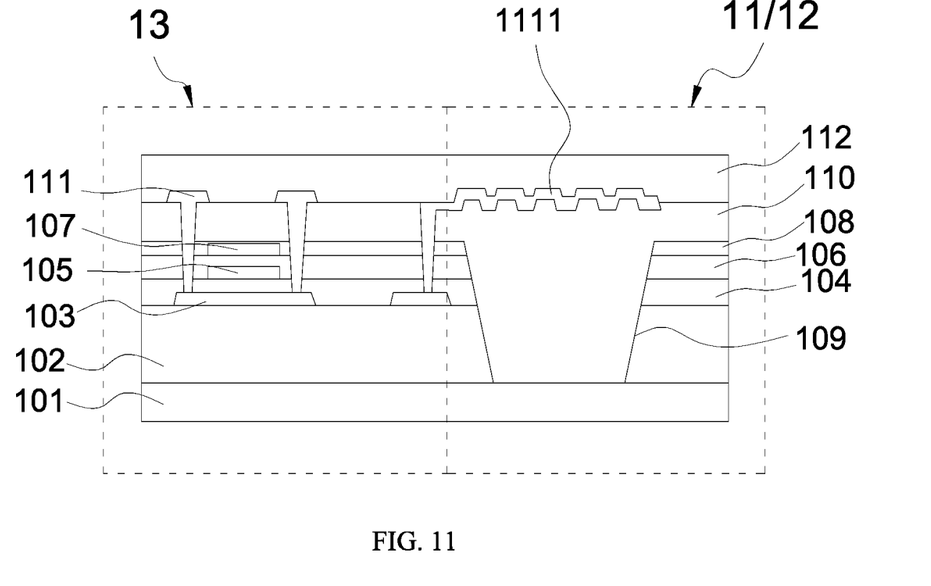
FIG. 11 is a schematic diagram of a structure obtained after completing the step 107 according to an embodiment of a method of fabricating a flexible OLED panel of the present invention.
Figure 12:
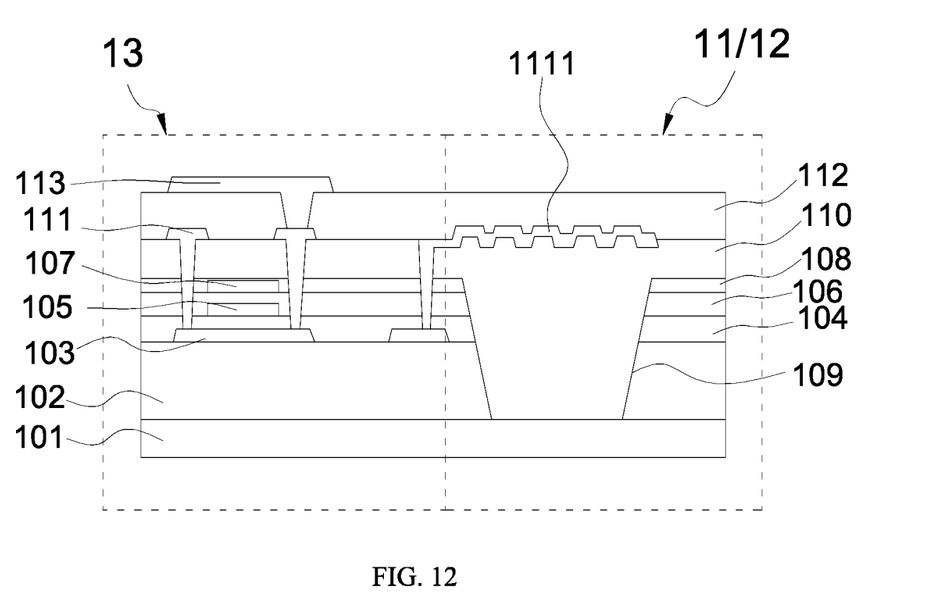
FIG. 12 is a schematic diagram of a structure obtained after completing the step 108 according to an embodiment of a method of fabricating a flexible OLED panel of the present invention.
Figure 13:
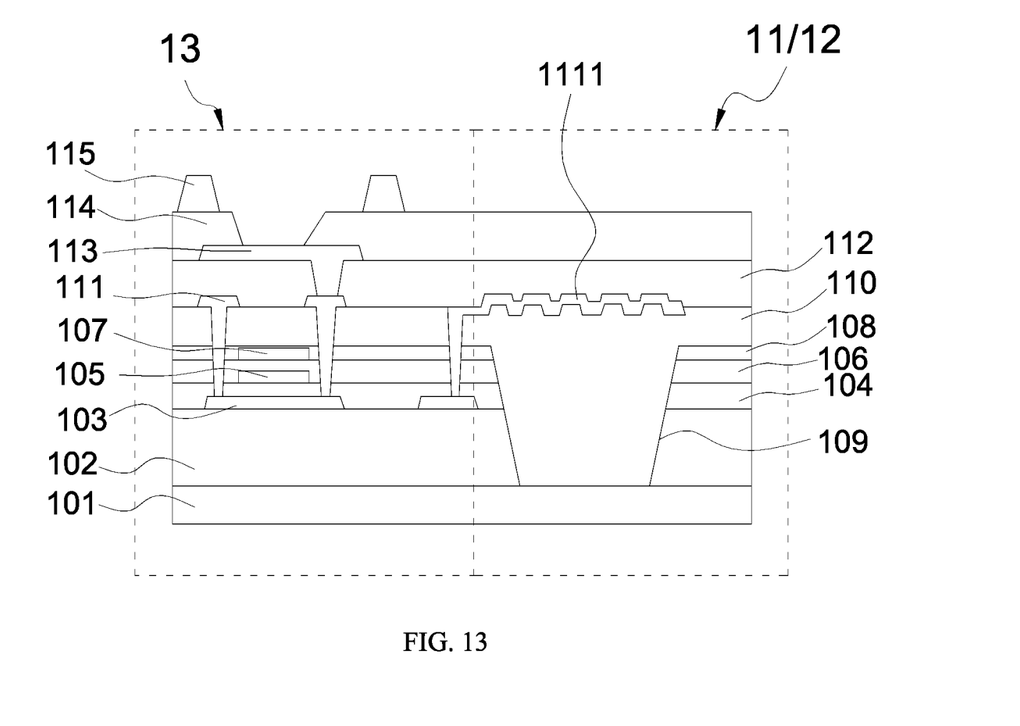
FIG. 13 is a schematic diagram of a structure obtained after completing the step 109 according to an embodiment of a method of fabricating a flexible OLED panel of the present invention.

Referring to FIG. 5 to FIG. 13, a method of fabricating a flexible OLED panel of the present invention is illustrated. The method of fabricating a flexible OLED panel of the present invention is used to fabricate the flexible OLED panel 100 of the first embodiment and the second embodiment, and the OLED panel 100 includes a display area 10 for configuring a pixel structure. The display area 10 includes a first bendable structure 11 for bending, a second bendable structure 12 for bending, and a display unit 13 in a subregion formed by intersecting the first bendable structure 11 and the second bendable structure 12. The method includes:

Step S101: providing a glass substrate;

Step S102: sequentially forming a flexible substrate 101, a buffer layer 102, an active layer 103, a first insulating layer 104, a first gate metal layer 105, a second insulating layer 106, a second gate metal layer 107, and a first interlayer dielectric on the glass substrate 108;

Step S103: forming recesses 109 at regions respectively corresponding to the first bendable structure 11 and the second bendable structure 12;

Step S104: forming a second interlayer dielectric layer 110 on the first interlayer dielectric layer 108 and filling the recess 109, the second interlayer dielectric layer 110 being made of an organic material;

Step S105: patterning the second interlayer dielectric layer 110 on the first bendable structure 11 and the second bendable structure 12, so that a surface of the second interlayer dielectric layer 110 is formed into an undulating shape;

Step S106: forming a source/drain metal layer 111 on the second interlayer dielectric layer 110, so that connection traces 1111 of the source/drain metal layers 111 at regions corresponding to the first bendable structure 11 and the second bendable structure 12 are in an undulating shape;

Step S107: forming a planarization layer 112 on the source/drain metal layer 111;

Step S108: forming an anode 113 at a region corresponding to the display unit 30 on the planarization layer 112; and Step S109: forming a pixel definition layer 114 and a spacer 116 on the anode.

In the method of fabricating a flexible OLED panel of the embodiment, in step S105, the second interlayer dielectric layer 110 at regions corresponding to the first bendable structure 11 and the second bendable structure 12 is subjected to a photolithography process using a halftone mask.

In the method of fabricating a flexible OLED panel of this embodiment, in step S103, the recess 109 is formed by one or two photolithography processes.

The structure of the flexible OLED panel manufactured by the method of the present invention is the same as that of the first embodiment or the second embodiment. For details, refer to the first embodiment and the second embodiment of the flexible OLED panel of the present invention, and the manufacturing methods are not repeated herein for brevity.

While the invention has been described in detail and with reference to specific embodiments thereof, it is to be understood that the foregoing description is exemplary and explanatory in nature and is intended to illustrate the invention and its preferred embodiments. Through routine experimentation, one skilled in the art will readily recognize that various changes and modifications can be made therein without departing from the spirit and scope of the invention.

What is claimed is:

1. A flexible organic light-emitting diode (OLED) panel comprising a display area for configuring a pixel structure, wherein the display area comprises:

a plurality of first bendable structures extending along a first direction for reducing bending stress in the display area perpendicular to the first direction;

a plurality of second bendable structures extending along a second direction for reducing bending stress in the display area perpendicular to the second direction, wherein the second bendable structure intersects the first bendable structure to form a plurality of sub-display areas; and a display unit disposed in the sub-display areas, the display unit comprising at least one sub-pixel;

the display area comprising:

a flexible substrate;

a buffer layer disposed on the flexible substrate;

an active layer disposed on the buffer layer;

a first insulating layer disposed on the active layer;

a first gate metal layer disposed on the first insulating layer;

a second insulating layer disposed on the first gate metal layer;

a second gate metal layer disposed on the second insulating layer; and a first interlayer dielectric layer disposed on the second gate metal layer;

a recess disposed at the display area corresponding to the first bendable structure and the second bendable structure, and penetrating through the buffer layer, the first insulating layer, the second insulating layer and the first interlayer dielectric layer;

a second interlayer dielectric layer disposed on the first interlayer dielectric layer and filling the recess, the second interlayer dielectric layer being made of an organic material;

wherein each of the first bendable structure and the second bendable structure comprises the recess and a portion of the second interlayer dielectric layer corresponding to the recess;

the display area comprising a center region located at a center position of the display area and a border region around the center region; and a density of the sub-display areas in the center region is greater than a density of the sub-display areas in the border region.

2. The flexible OLED panel of claim 1, wherein the recess of the first bendable structure extends along the extending direction of the first bendable structure, and the recess of the second bendable structure extends along the extending direction of the second bendable structure.

3. The flexible OLED panel of claim 1, wherein the display region further comprises a source/drain metal layer disposed on the second interlayer dielectric layer, wherein connection traces of the source/drain metal layers at regions corresponding to the first bendable structure and the second bendable structure are in an undulating shape.

4. The flexible OLED panel of claim 3, wherein the flexible OLED panel comprises a first metal line passing through the first bendable structure and disposed in a same level as the source/drain metal layer and a second metal line passing through the second bendable structure and disposed in a different level from the source/drain metal layer, wherein the first metal trace comprises the connection traces at the region corresponding to the first bendable structure, while the second metal trace comprises the connection traces at the region corresponding to the second bendable structure.

5. The flexible OLED panel of claim 3, wherein the source/drain metal layer comprises a titanium sublayer, an aluminum sublayer, and a titanium sublayer disposed sequentially.

6. The flexible OLED panel of claim 1, wherein a number of the sub-pixels of each display unit at the center region is less than a number of the sub-pixels of each display unit at the border region.

7. A flexible OLED panel comprising a display area for configuring a pixel structure, wherein the display area comprises:

a plurality of first bendable structures extending along a first direction, the first bendable structures for reducing bending stress in the display area perpendicular to the first direction;

a plurality of second bendable structures extending along a second direction the second bendable structures for reducing bending stress in the display area perpendicular to the second direction, wherein the second bendable structure intersects the first bendable structure to form a plurality of sub-display areas;

a display unit disposed in the sub-display areas, the display unit comprising at least one sub-pixel, and wherein the display area comprises:

a flexible substrate;

a buffer layer disposed on the flexible substrate;

an active layer disposed on the buffer layer;

a first insulating layer disposed on the active layer;

a first gate metal layer disposed on the first insulating layer;

a second insulating layer disposed on the first gate metal layer;

a second gate metal layer disposed on the second insulating layer; and a first interlayer dielectric layer disposed on the second gate metal layer;

a recess disposed at the display area corresponding to the first bendable structure and the second bendable structure, and penetrating through the buffer layer, the first insulating layer, the second insulating layer and the first interlayer dielectric layer; and a second interlayer dielectric layer disposed on the first interlayer dielectric layer and filling the recess, the second interlayer dielectric layer being made of an organic material;

wherein each of the first bendable structure and the second bendable structure comprises the recess and a portion of the second interlayer dielectric layer corresponding to the recess.

8. The flexible OLED panel of claim 7, wherein the recess of the first bendable structure extends along the extending direction of the first bendable structure, and the recess of the second bendable structure extends along the extending direction of the second bendable structure.

9. The flexible OLED panel of claim 7, wherein the display region further comprises a source/drain metal layer disposed on the second interlayer dielectric layer, wherein connection traces of the source/drain metal layers at regions corresponding to the first bendable structure and the second bendable structure having an undulating shape.

10. The flexible OLED panel of claim 9, wherein the flexible OLED panel comprises a first metal line passing through the first bendable structure and disposed in a same level as the source/drain metal layer and a second metal line passing through the second bendable structure and disposed in a different level from the source/drain metal layer, wherein the first metal trace comprises the connection traces at the region corresponding to the first bendable structure, while the second metal trace comprises the connection traces at the region corresponding to the second bendable structure.

11. The flexible OLED panel of claim 9, wherein the source/drain metal layer comprises a titanium sublayer, an aluminum sublayer, and a titanium sublayer disposed sequentially.

12. The flexible OLED panel of claim 7, wherein the display area comprising a center region located at a center position of the display area and a border region 1 around the center region; a density of the sub-display areas in the center region is greater than a density of the sub-display areas in the border region.

13. The flexible OLED panel of claim 12, wherein a number of the sub-pixels of each display unit at the center region is less than a number of the sub-pixels of each display unit at the border region.

14. A method of fabricating a flexible OLED panel, wherein the OLED panel comprises a display area for configuring a pixel structure, the display area comprising a first bendable structure for bending, a second bendable structure for bending, and a display unit disposed in sub-display areas defined by intersecting the first bendable structure and the second bendable; the method comprising:

S101: providing a glass substrate;

S102: sequentially forming a flexible substrate, a buffer layer, an active layer, a first insulating layer, a first gate metal layer, a second insulating layer, a second gate metal layer, and a first interlayer dielectric on the glass substrate;

S103: forming recesses at regions respectively corresponding to the first bendable structure and the second bendable structure;

S104: forming a second interlayer dielectric layer on the first interlayer dielectric layer and filling the recess, the second interlayer dielectric layer being made of an organic material;

S105: patterning the second interlayer dielectric layer on the first bendable structure and the second bendable structure, so that a surface of the second interlayer dielectric layer is formed into an undulating shape; and S106: forming a source/drain metal layer on the second interlayer dielectric layer, so that connection traces of the source/drain metal layers at regions corresponding to the first bendable structure and the second bendable structure are in an undulating shape.

15. The method of fabricating a flexible OLED panel according to claim 14, wherein in the step S105, the second interlayer dielectric layer corresponding to the recess region is subjected to a photolithography process using a halftone mask.

16. The manufacturing method of the flexible OLED panel according to claim 14, wherein the recess of the first bendable structure extends along the extending direction of the first bendable structure, and the recess of the second bendable structure extends along the extending direction of the second bendable structure.

17. The method of fabricating a flexible OLED panel according to claim 14, wherein the flexible OLED panel comprises a first metal line passing through the first bendable structure and disposed in a same level as the source/drain metal layer and a second metal line passing through the second bendable structure and disposed in a different level from the source/drain metal layer, wherein the first metal trace comprises the connection traces at the region corresponding to the first bendable structure, while the second metal trace comprises the connection traces at the region corresponding to the second bendable structure.

18. The method of fabricating a flexible OLED panel according to claim 14, wherein the source/drain metal layer comprises a titanium sublayer, an aluminum sublayer, and a titanium sublayer disposed sequentially.

19. The method of fabricating a flexible OLED panel according to claim 14, wherein the display area comprises a center region located at a center position of the display area and a border region around the center region; and a density of the sub-display areas in the center region is greater than the density of the sub-display areas located in the border region.

\* \* \* \* \*